US012718876B2

(12) United States Patent
Doluca et al.

(10) Patent No.: US 12,718,876 B2
(45) Date of Patent: Aug. 25, 2026

(54) FIELD-PROGRAMMABLE GATE ARRAY (FPGA) CONFIGURABLE CELL WITH P AND N PASS GATES TO SAME BIT LINE

(71) Applicant: Aril Computer Corporation, Los Altos, CA (US)

(72) Inventors: Sinan Doluca, Saratoga, CA (US); Thomas Riordan, Los Altos, CA (US)

(73) Assignee: Aril Computer Corporation, Los Altos, CA (US)

( * ) Notice: Subject to any disclaimer, the term of this patent is extended or adjusted under 35 U.S.C. 154(b) by 0 days.

(21) Appl. No.: 18/911,727

(22) Filed: Oct. 10, 2024

(65) Prior Publication Data

US 2025/0364041 A1 Nov. 27, 2025

Related U.S. Application Data

(63) Continuation-in-part of application No. 18/671,872, filed on May 22, 2024.

(51) Int. Cl.

| | |
|---|---|
| ***G11C 11/419*** | (2006.01) |
| ***G11C 11/412*** | (2006.01) |
| ***H03K 19/17728*** | (2020.01) |
| ***H03K 19/1776*** | (2020.01) |
| ***H03K 19/17784*** | (2020.01) |
| ***H10B 10/00*** | (2023.01) |

(52) U.S. Cl.

CPC .......... *G11C 11/419* (2013.01); *G11C 11/412* (2013.01); *H03K 19/17728* (2013.01); *H03K 19/1776* (2013.01); *H03K 19/17784* (2013.01); *H10B 10/12* (2023.02)

(58) Field of Classification Search

CPC .. G11C 11/412; H10B 10/12; H03K 19/1772; H03K 19/1776; H03K 19/1778

See application file for complete search history.

(56) References Cited

U.S. PATENT DOCUMENTS

| | | | | |
|---|---|---|---|---|
| 7,046,041 | B1 | 5/2006 | Zhou | |
| 7,397,693 | B2 | 7/2008 | Yamaoka et al. | |
| 7,564,725 | B2 | 7/2009 | Houston | |
| 7,606,062 | B2 * | 10/2009 | Hsu | G11C 11/419 365/185.01 |

(Continued)

*Primary Examiner* — Sung Il Cho

(74) *Attorney, Agent, or Firm* — gPatent LLC; Stuart T. Auvinen

(57) ABSTRACT

A Field-Programmable Gate Array (FPGA) RAM cell has cross-coupled inverters and transmission gates to bit lines. Each transmission gate has n-channel and p-channel transistors in parallel that both turn on during writing and reading in configuration mode, but remain off for mission mode when the FPGA performs the configured logic functions. For configurable switching fabric, the FPGA RAM cell has nodes from the cross-coupled inverters drive gates of p-channel and n-channel transistors in parallel that form a transmission gate between a switch input and a switch output in the configurable switching fabric. For configurable logic blocks, the FPGA RAM cell has a node from the cross-coupled inverters driving gates of p-channel and n-channel data transistors in a four-transistor stack with p-channel and n-channel select transistors controlled by a logic input. The row of FPGA RAM cells store a Look-Up Table (LUT) and perform first-level muxing.

14 Claims, 11 Drawing Sheets

(56) References Cited

U.S. PATENT DOCUMENTS

| | | | | |
|---|---|---|---|---|
| 7,623,405 | B2 | 11/2009 | Lysinger et al. | |
| 7,675,317 | B2 | 3/2010 | Perisetty | |
| 7,688,669 | B2 | 3/2010 | McClure et al. | |
| 7,714,610 | B2 | 5/2010 | He | |
| 7,760,538 | B1 | 7/2010 | Paak | |
| 7,957,177 | B2 | 6/2011 | Perisetty | |
| 8,279,660 | B2 | 10/2012 | Perisetty | |
| 8,351,248 | B1 | 1/2013 | Hart | |
| 8,755,218 | B2 | 6/2014 | Lee et al. | |
| 8,773,940 | B2 | 7/2014 | Badrudduza | |
| 9,153,292 | B2 | 10/2015 | Wu | |
| 9,154,134 | B2 | 10/2015 | Voogel et al. | |
| 10,431,269 | B2 | 10/2019 | Kumar et al. | |
| 11,170,844 | B1 | 11/2021 | Doluca et al. | |
| 11,190,178 | B1 | 11/2021 | Collins et al. | |
| 2007/0171713 | A1* | 7/2007 | Hunter | G11C 11/413<br>365/185.07 |
| 2015/0357009 | A1* | 12/2015 | Sinangil | H10D 89/10<br>365/156 |
| 2019/0228825 | A1* | 7/2019 | Hecht | G11C 11/419 |
| 2024/0055048 | A1* | 2/2024 | Sinangil | G11C 11/418 |
| 2024/0257867 | A1 | 8/2024 | You et al. | |
| 2024/0282364 | A1 | 8/2024 | You et al. | |
| 2025/0006282 | A1 | 1/2025 | Chang et al. | |
| 2025/0316306 | A1 | 10/2025 | You et al. | |

* cited by examiner

AB1
AB2
140
142
144
146
150
152
154
156
BB
VDD
VSS
82
B
AB
80
A
EN
VSSM
36
ENB
OUT
LUT
CELL
SELB
60
SEL
SRAM
10
BL
BLB

AB3
AB4
BB
B
AB
A
EN
ENB
BL
BLB
160
162
164
166
170
172
174
176
OUT
LUT
CELL
SELB
SEL
60
SRAM
10

| MODE OF OPERATION | VDDM | VSSM |
| --- | --- | --- |
| PROGRAM (WRITE) | VDD | VSS |
| VERIFY (READ) | VDD+ | VSS |
| MISSION MODE (LOGIC) | VDD+ | VSS- |

FIG. 6

FIELD-PROGRAMMABLE GATE ARRAY (FPGA) CONFIGURABLE CELL WITH P AND N PASS GATES TO SAME BIT LINE

RELATED APPLICATION

This application is a Continuation-In-Part (CIP) of "Multi-Port Static Random-Access Memory (SRAM) with Buffered Read Port and P and N Pass Gates to Same Write Bit Line", U.S. Ser. No. 18/671,872, filed on May 22, 2024.

FIELD OF THE INVENTION

This invention relates to Field-Programmable Gate Array (FPGA), and more particularly to memory cells for controlling switching fabric and logic elements in a FPGA.

BACKGROUND OF THE INVENTION

Prototypes of complex digital electronic systems are sometimes made using one or more Programmable Logic Devices (PLDs) such as a Field-Programmable Gate Array (FPGA). The unprogrammed FPGA Integrated Circuit (IC) can be soldered into a target system and then programmed by the system designer. The FGPA can be re-programmed as needed as design changes are needed.

Rather than use a non-volatile memory to store the configuration, a FPGA chip uses a volatile memory such as a Static Random-Access Memory (SRAM) to store its configuration. The configuration can be scanned into the FPGA chip and written to this internal SRAM at each power-up or initialization, such as after being read from an external flash memory chip.

FIG. 1 shows a prior-art FPGA. A large FPGA chip can have hundreds or thousands of configurable logic blocks 120, and hundreds or thousands of muxes 130 in configurable switching fabric 110 that connect the logic blocks together and to the input and output of the FPGA. Mux 130 can be a N-input mux with control signals that cause mux 130 to select one of its N inputs for output (Q1). For example, mux 130 can be an 8-input mux (N=8), with three control signals. During configuration or initialization, configuration bits can be scanned into the FPGA chip and written to SRAM cells 34 in configurable switching fabric 110. There can be three single-bit SRAM cells 34 that drive the three control signals to mux 130. For example, when the 3 bits written into SRAM cells 34 are 010, control signals of 010 are applied to mux 130, causing mux 130 to connect input D3 to output Q1.

Any arbitrary Boolean logic function can be implemented by a Look-Up Table (LUT). For example, a 16-entry by 1-bit-wide LUT can have four control inputs (address bits) to select one of the 16 entries to drive the output bit. The LUT can be programmed with the logic table for the desired logic function.

Each configurable logic block 120 can have N SRAM cells 30, each storing one bit or entry of the LUT. Four control inputs A, B, C, D are input to configurable logic block 120, such as from outputs of configurable switching fabric 110. These four inputs cause mux 131 to select one of the N outputs of SRAM cells 30 as output Q2 of the logic function programmed into configurable logic block 120.

Although non-volatile memory cells can be smaller than SRAM cells, a special semiconductor process is needed to add the non-volatile memory cells. SRAM can be constructed from a standard semiconductor process, so manufacturing costs can be lower even with a larger size for SRAM cells.

Semiconductor memories such as Static Random-Access Memory (SRAM) scale their supply voltages as cell transistors shrink in size with improving semiconductor processing technologies. A traditional SRAM cell has four transistors that form a latch that stores a bit of data, and two pass transistors that connect the latch to a pair of bit lines. Both reading and writing of the cell are performed through these pass transistors in the traditional six-transistor 6T SRAM cell.

As device sizes shrink with process improvements, the power supply voltage also must be reduced to prevent device damage. However, lower power supply voltages can cause problems with the traditional 6T SRAM cell, such as read disturb and insufficient write margins.

Large FPGAs can have large leakage currents. Sometimes the threshold voltage of the transistors are increased to reduce leakage, but this can reduce performance and speed. When supply voltages are reduced, the remaining voltage margins may be too small when device thresholds are increased.

What is desired is a SRAM cell for configuration memory in a FPGA. A SRAM cell with an equal number of PMOS and NMOS transistors is desired to better fit into the layout of cells in a FPGA. A balanced PMOS/NMOS SRAM cell that can operate at ultra-low supply voltages is desirable. A FPGA SRAM cell with reduced leakage is desired. A FPGA SRAM cell that drives higher voltages to downstream muxes and logic is desired to reduce leakage of downstream transistors.

A FPGA SRAM cell with both NMOS and PMOS pass transistors to the write bit lines is desired to allow for full CMOS complimentary writing into the cell to improve write margins, even at very low supply voltages.

BRIEF DESCRIPTION OF THE DRAWINGS

FIG. 6 is a table showing boosted supply voltages to the FPGA SRAM cells to improve cell margin and reduce leakage in a FPGA.

DETAILED DESCRIPTION

The present invention relates to an improvement in Field-Programmable Gate Array (FPGA) configuration memory. The following description is presented to enable one of ordinary skill in the art to make and use the invention as provided in the context of a particular application and its requirements. Various modifications to the preferred embodiment will be apparent to those with skill in the art, and the general principles defined herein may be applied to other embodiments. Therefore, the present invention is not intended to be limited to the particular embodiments shown and described, but is to be accorded the widest scope consistent with the principles and novel features herein disclosed.

The parent application "Multi-Port Static Random-Access Memory (SRAM) with Buffered Read Port and P and N Pass Gates to Same Write Bit Line", U.S. Ser. No. 18/671,872, filed on May 22, 2024, disclosed a 1R1 W SRAM cell having a write-only RAM cell with a buffered read port. Write margins and read disturb are improved by having both n-channel and p-channel pass transistors in parallel to the same bit lines and a buffered read port.

Figure 1:
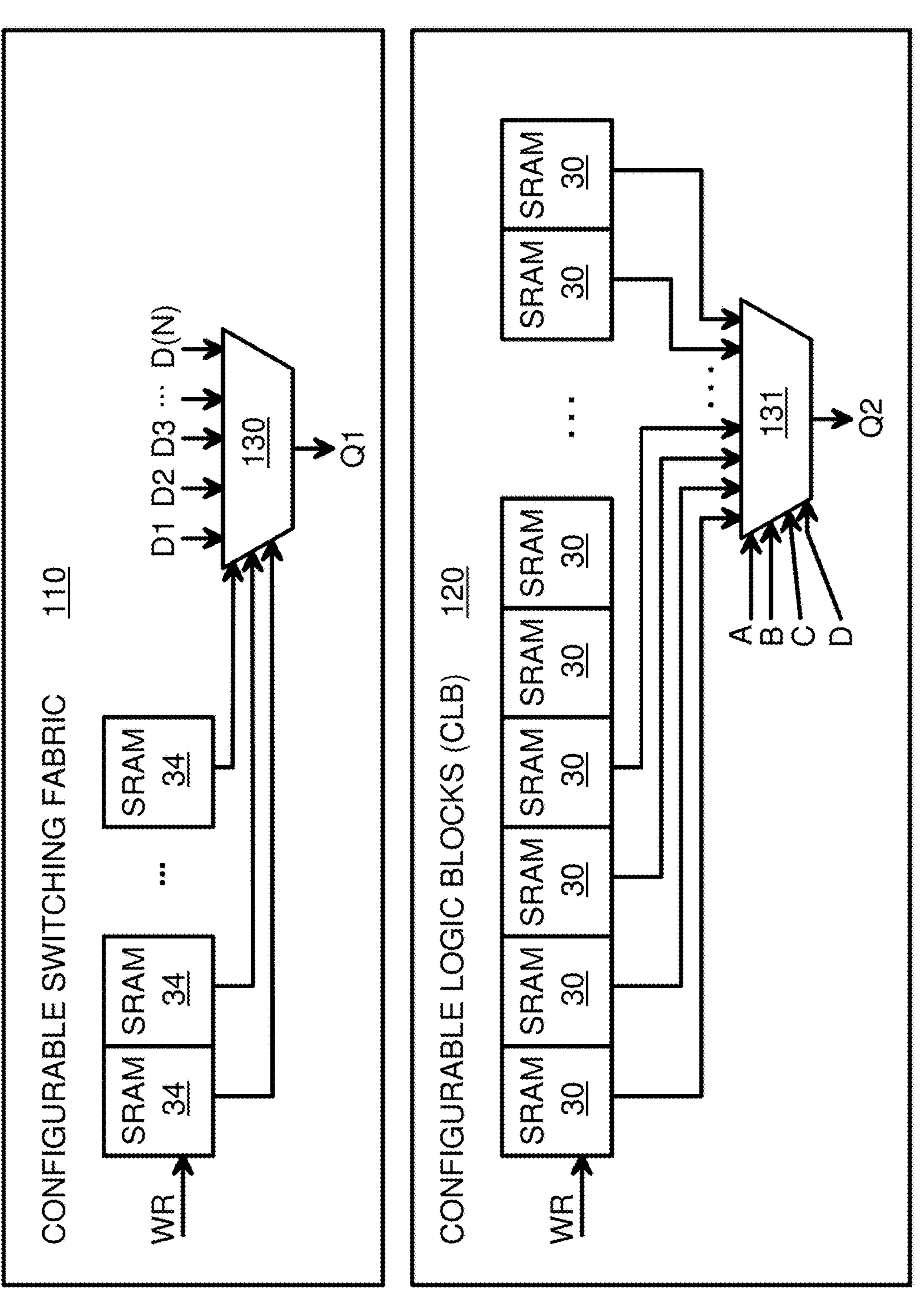
FIG. 1 shows a prior-art FPGA.

The inventors realize that this 1R1W SRAM cell can be modified for use in a FPGA. In particular, the first level of switching (muxing) can be integrated with the read port of the SRAM cell for use in configurable switching fabric 110 (FIG. 1). Also, the read port in the 1R1 W SRAM cell can be modified to perform the first level of selection in a LUT in configurable logic block 120 (FIG. 1).

Figure 2:
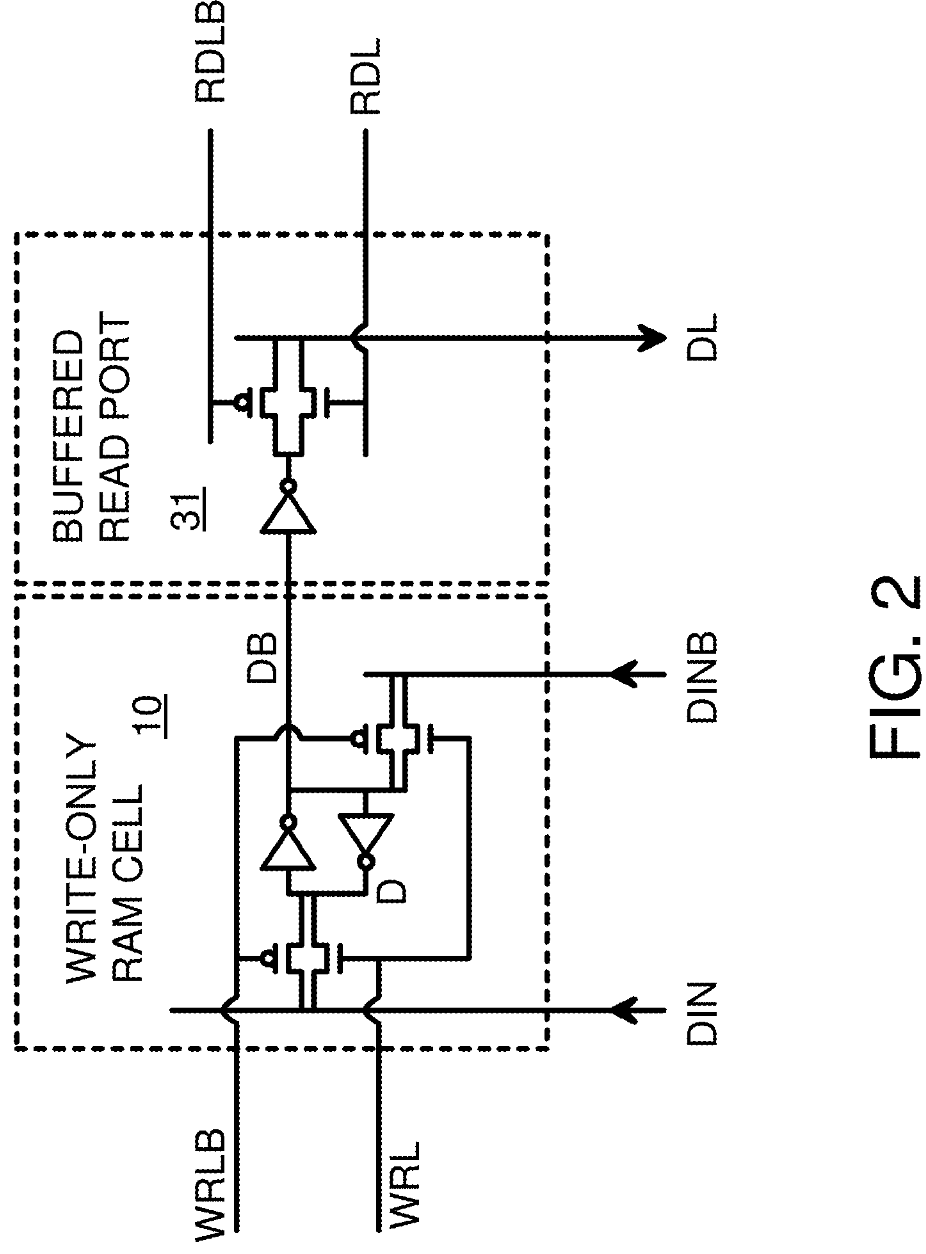
FIG. 2 is a diagram of a multiport 1R1 W SRAM cell with a write-only RAM with both P and N transistors in parallel to write bit lines, and a buffered read port to a read data line, as disclosed in the parent application.
Figure 3:
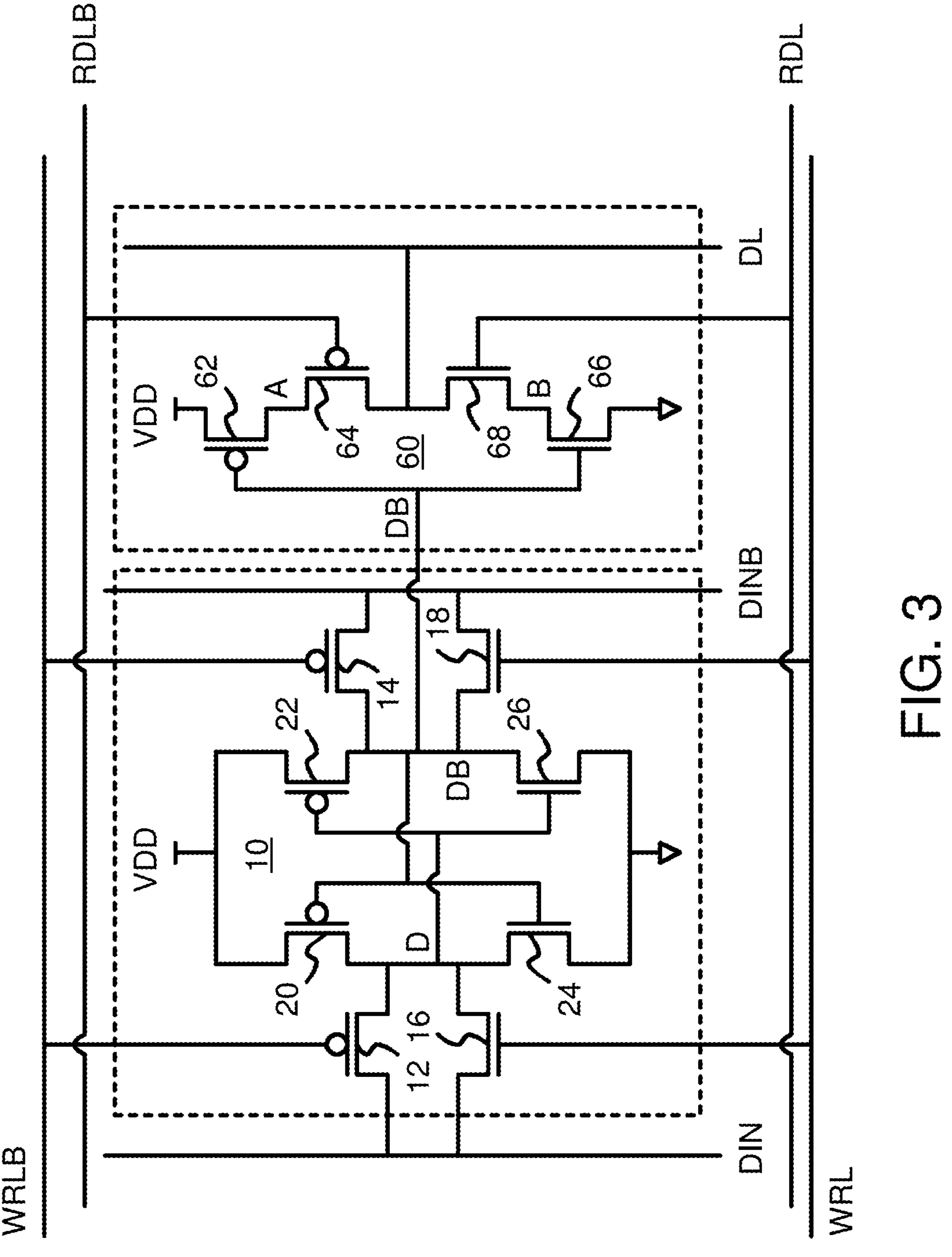
FIG. 3 is a schematic diagram of a write-only RAM cell with a tri-state buffer read port, as disclosed in the parent application.
Figure 4:
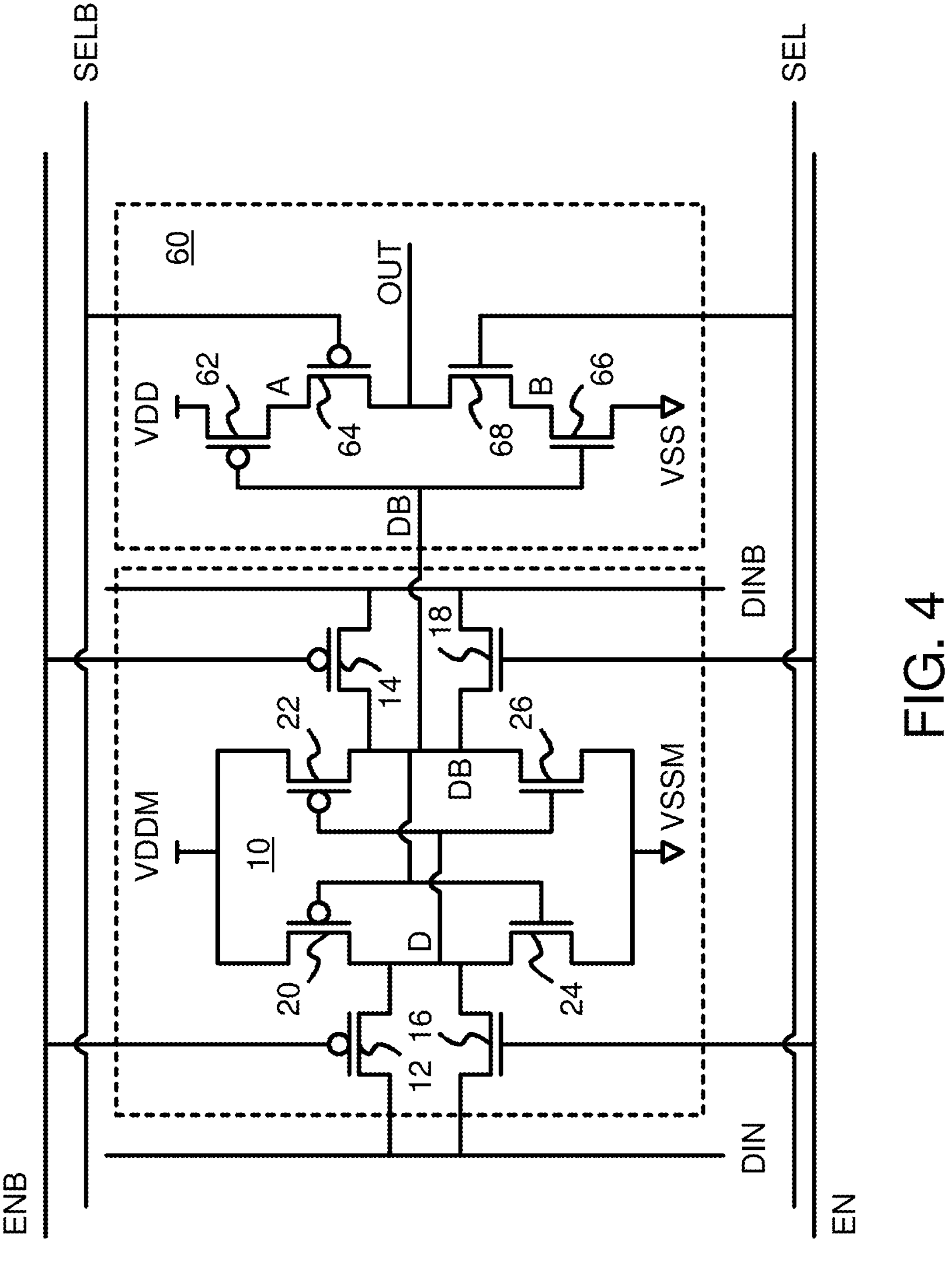
FIG. 4 is a schematic diagram of a FPGA SRAM cell for use in a FPGA LUT.
Figure 7:
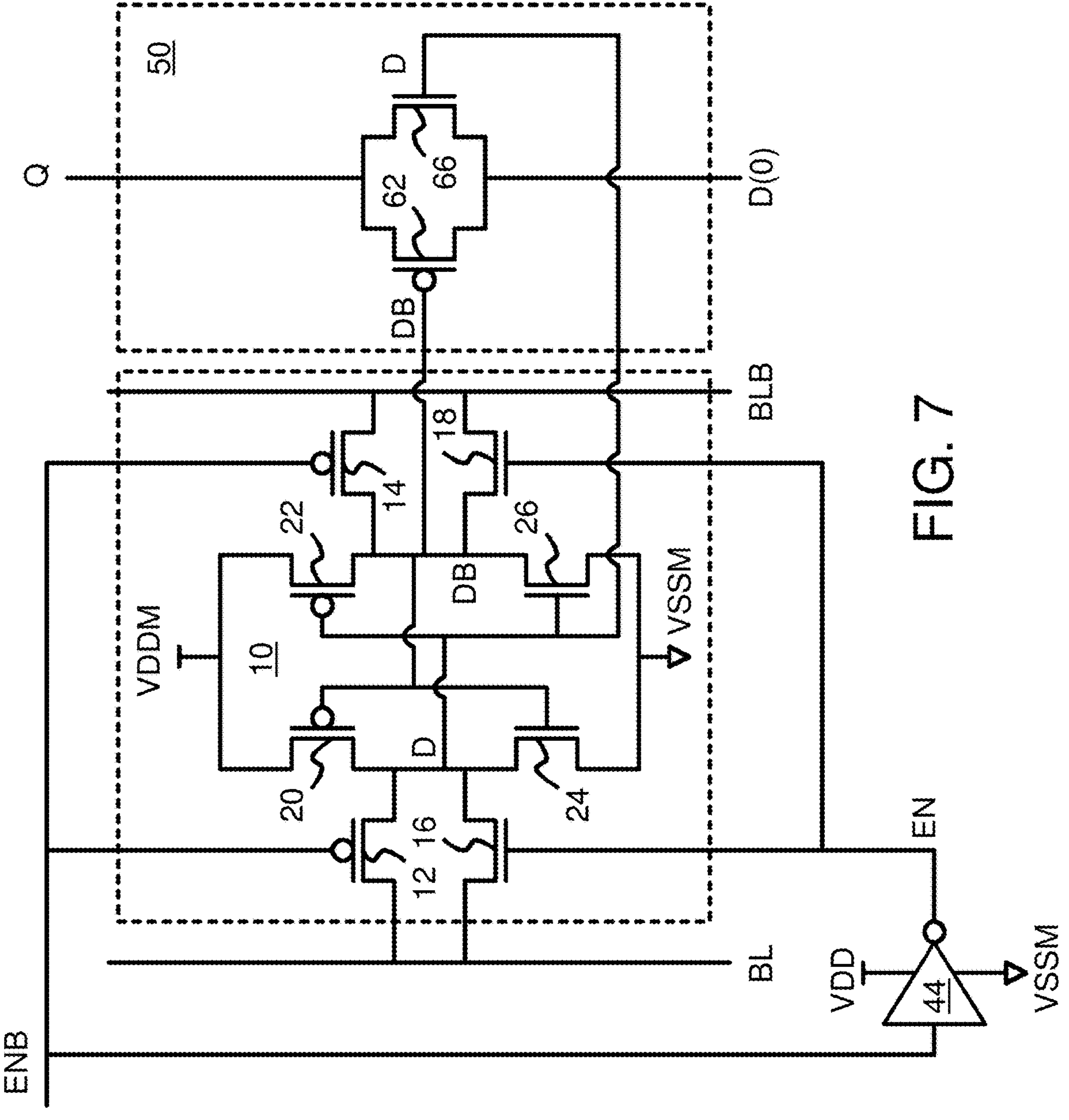
FIG. 7 is a schematic diagram of a FPGA SRAM cell for use in a FPGA's configurable switching fabric.

FIGS. 2-3 show this 1R1 W SRAM cell from the parent application. FIG. 4 shows the 1R1 W SRAM cell with its read port modified for use as a LUT cell selector for use in configurable logic block 120. FIG. 7 shows the 1R1W SRAM cell with its read port modified for use as a switch cell in configurable switching fabric 110.

FIG. 2 is a diagram of a multiport 1R1W SRAM cell with a write-only RAM with both P and N transistors in parallel to write bit lines, and a buffered read port to a read data line, as disclosed in the parent application. Cell 10 stores one bit of data D in a latch created by cross-coupled inverters. Cell 10 is written when the row is selected by Write Row Line (WRL) being high and WRLB being low. WRLB is the inverse of WRL. WRL high turns on the n-channel pass transistors and WRLB low turns on the p-channel pass transistors, so all four pass transistors are turned on when writing.

The input data on write bit line DIN drives through both n-channel and p-channel pass transistors to node D in the cell latch, while inverse input data on write bit line DINB drives through another pair of n-channel and p-channel pass transistors to inverse node DB in the cell latch. Thus the cell latch is written by differential data through two very low impedance transmission gates. This allows for a fast write even when ultra-low power-supply voltages are used. Cell write margin is very good.

The overall cell margin and stability is further enhanced by using buffered read port 31. A traditional read port has pass transistors from the cell latch to one or two read bit lines. When the read row is selected and the read pass transistors turn on, charge sharing occurs between the read bit lines and the cell latch. This charge sharing can disturb the cell latch, perhaps causing loss of the data being stored at the margin conditions.

Instead, in a simple embodiment buffered read port 31 has the cell latch's inverse data node DB applied to the input of an inverter. Since the inverter input is typically the gates of a pair of n-channel and p-channel transistors, there is little or no charge sharing between buffered read port 31 and the cell latch in cell 10. The buffered data from the cell latch is driven by the inverter in buffered read port 31 through a pair of p-channel and n-channel transistors to a read data line DL when the read row is selected with RDL high and RDLB low.

In the parent application, cell 10 is not directly read except through buffered read port 31, so cell 10 is a write-only RAM cell. Write-only RAM cell 10 and buffered read port 31 together form a 1R1 W SRAM cell.

FIG. 3 is a schematic diagram of a write-only RAM cell with a tri-state buffer read port, as disclosed in the parent application. In this 1R1 W SRAM cell, buffered read port 60 has a tri-state inverter. The transmission gate is integrated into the inverter. Write-only RAM cell 10 is the same as described for FIG. 2.

The drains of p-channel transistor 20 and n-channel transistor 24 are connected together at data node D and to the gates of p-channel transistor 22 and n-channel transistor 26, which have their drains connected together and to the gates of p-channel transistor 20 and n-channel transistor 24, forming a pair of cross-coupled inverters. The drains of transistors 22, 26 drive the inverse data node DB of the cell latch. The sources of n-channel transistors 24, 26 connect to ground, while the sources of p-channel transistors 20, 22 connect to the power supply VDD.

As with a traditional 6T SRAM cell, only a single pair of bit lines DIN, DINB, connect to write-only RAM cell 10. However, full transmission gates are provided to connect the cell latch to the write bit lines DIN, DINB.

During a write operation, write word line WRLB drives the gates of p-channel pass transistors 12, 14 low, allowing bit line DIN to drive the drains of transistors 20, 24 through p-channel pass transistor 12, and allowing complementary bit line DINB to drive the drains of transistors 22, 26 through p-channel pass transistor 14, thus writing data into cell 10.

To improve the write margin, both P and N pass transistors are turned on for a write, so that p-channel pass transistor 12 and n-channel pass transistor 16 act as a transmission gate between the cell latch and bit line DIN. Likewise, p-channel pass transistor 14 and n-channel pass transistor 18 act as a transmission gate to DINB.

During a write, write word line WRL is activated by driving it high, and inverse write word line WRLB is also activated by driving it low, so that all pass transistors 12, 14, 16, 18 are turned on.

Buffered read port 60 has a single logic gate that receives inverse data node DB on the gates of p-channel transistor 62 and n-channel transistor 66. The source of p-channel transistor 62 is connected to VDD, while its drain connects to the source of p-channel transistor 64. The gate of p-channel transistor 64 is the inverse read row line RDLB, and its drain is read bit line DL.

Similarly, the source of n-channel transistor 66 is connected to ground, while its drain connects to the source of n-channel transistor 68. The gate of n-channel transistor 68 is the read row line RDL, and its drain is read bit line DL.

When the current row is not selected, or when reading is not occurring, RDL is low and RDLB is high, turning off transistors 68, 64 and isolating buffered read port 60 from read bit line DL.

When the current row is selected during a read operation, RDL is high, turning on n-channel transistor 68. RDLB is low, turning on p-channel transistor 64. Then the inverse data DB from the latch inside write-only RAM cell 10 can drive data onto read data line DL. When DB is low, p-channel transistor 62 turns on, driving DL high through p-channel transistor 64. When DB is high, n-channel transistor 66 turns on, driving DL low through n-channel transistor 66. Thus the inverted cell data DB is inverted again through buffered read port 60.

Buffered read port 60 is a static read port since the read bit line is driven both high and low. Precharging of the read bit line is not required for the correct data to be read eventually.

FIG. 4 is a schematic diagram of a FPGA SRAM cell for use in a FPGA LUT. While the parent application 1R1 W SRAM cell (FIG. 3) uses bit lines DIN, DINB only for writing, the inventors realize that both reading and writing can be performed using bit lines BL, BLB during FPGA configuration. After configuration, during mission mode, reading and writing of RAM cell 10 are not performed, Instead, the data bit stored in RAM cell 10 provides the data selected by LUT cell 60.

RAM cell 10 can be read by driving word lines EN high and ENB low, turning on all four pass transistors 12, 14, 16, 18. Then the data stored in RAM cell 10 is driven onto bit lines BL, BLB. The data read to BL, BLB can be read by downstream logic, such as sense amplifiers, latches, or scan flip-flops. During configuration mode when reading is performed, read speed is not critical, so slow reads can be tolerated. Read disturb can be reduced by using an elevated power-supply voltage (VDDM) to RAM cell 10, as shown later in FIGS. 6-7.

RAM cell 10 can be written by driving word lines EN high and ENB low, turning on all four pass transistors 12, 14, 16, 18. The write data is driven to bit line BL while the inverse write data is driven to bit line BLB. This write data is driven through pass transistors 12, 14, 16, 18 to write into the cross-coupled inverters. Since there are both p-channel and n-channel transistors in parallel for the pass transistors, there is not a significant voltage drop across the pass transistors that can reduce write margin.

When select lines are inactive, SEL is low and SELB is high, transistors 64, 66 are turned off. The data bit stored in RAM cell 10 is isolated from output OUT. When select lines are active, SEL is high and SELB is low, transistors 64, 66 are turned on. When the data bit D stored in RAM cell 10 is high, DB is low and p-channel transistor 62 is on and n-channel transistor 66 is off, causing OUT to be driven high through p-channel transistors 62, 64. When the data bit D stored in RAM cell 10 is low, DB is high and p-channel transistor 62 is off and n-channel transistor 66 is on, causing OUT to be driven low through n-channel transistors 66, 68. Thus when SEL is high, the data bit stored in RAM cell 10 is driven to output OUT.

RAM cell 10 and LUT cell 60 can be laid out as a single cell of FPGA configuration memory, and can be arrayed into rows and columns for efficient layout. Cell layouts can be mirrored or reflected as desired. LUT cell 60 can receive VDD, VSS, as its supplies, while RAM cell 10 can receive VDDM, VSSM as supplies.

Figure 5A:
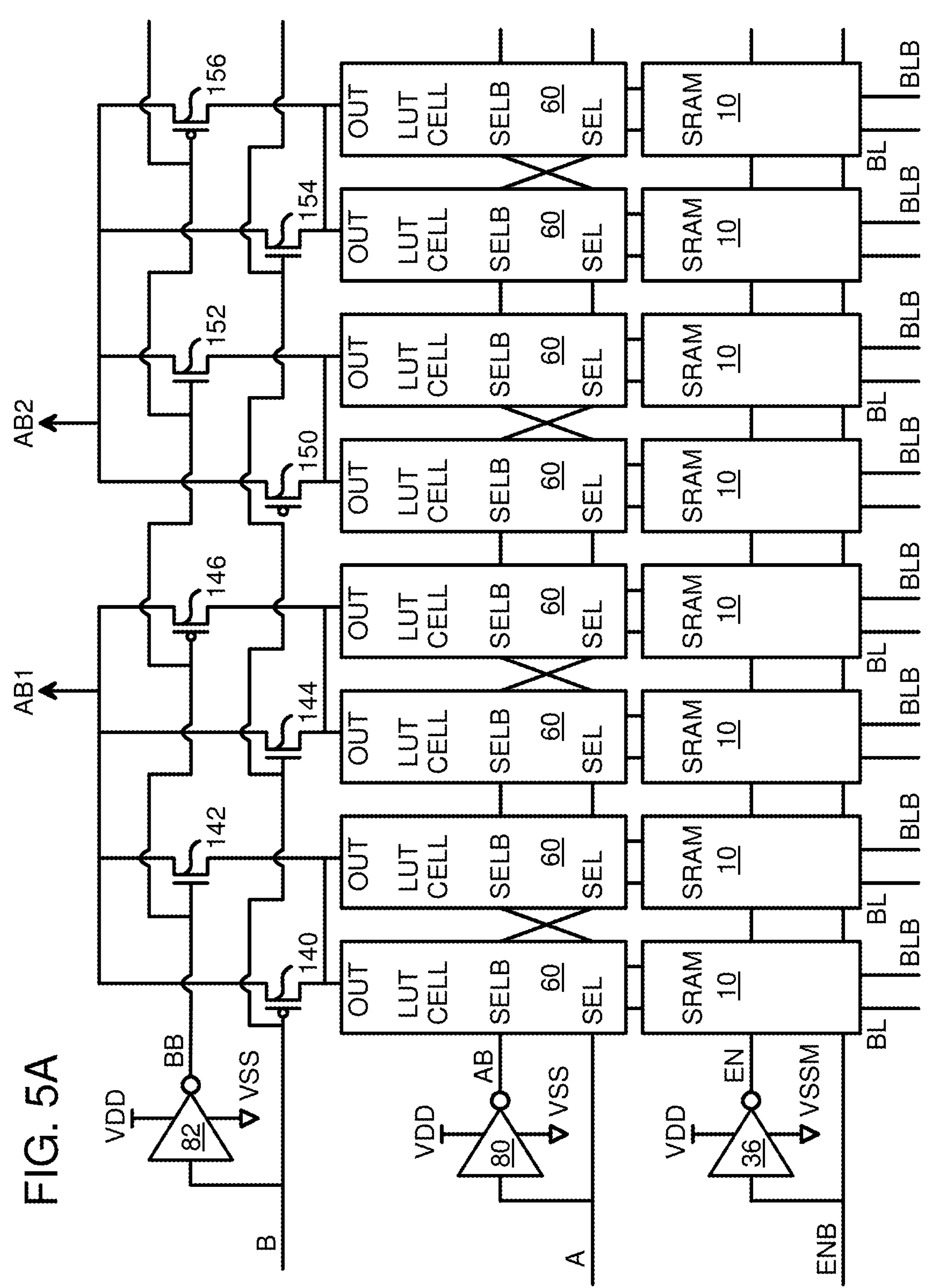
FIGS. 5A-5C show a configurable logic block using the FPGA SRAM cell of FIG. 4.
Figure 5B:
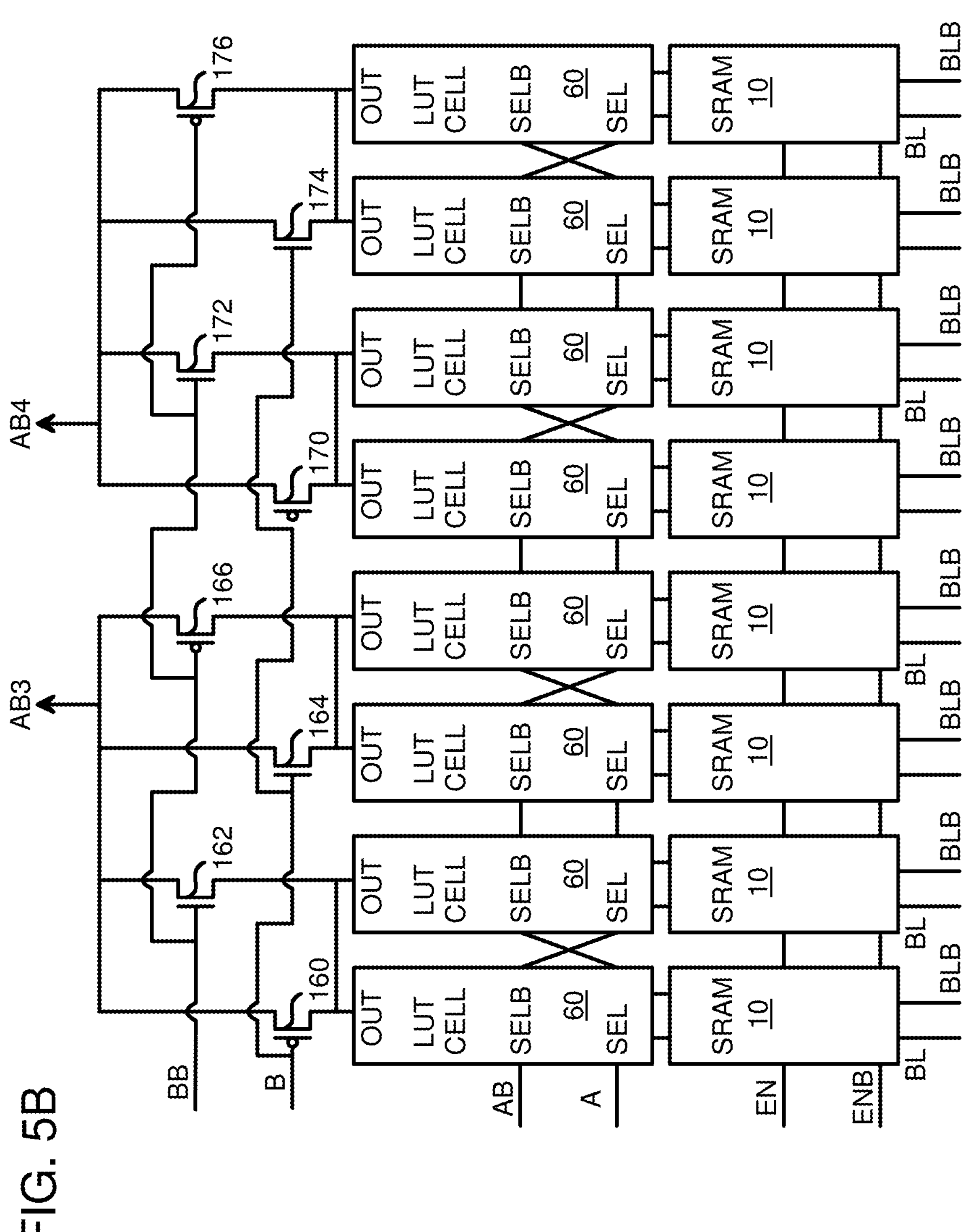
Figure 5C:
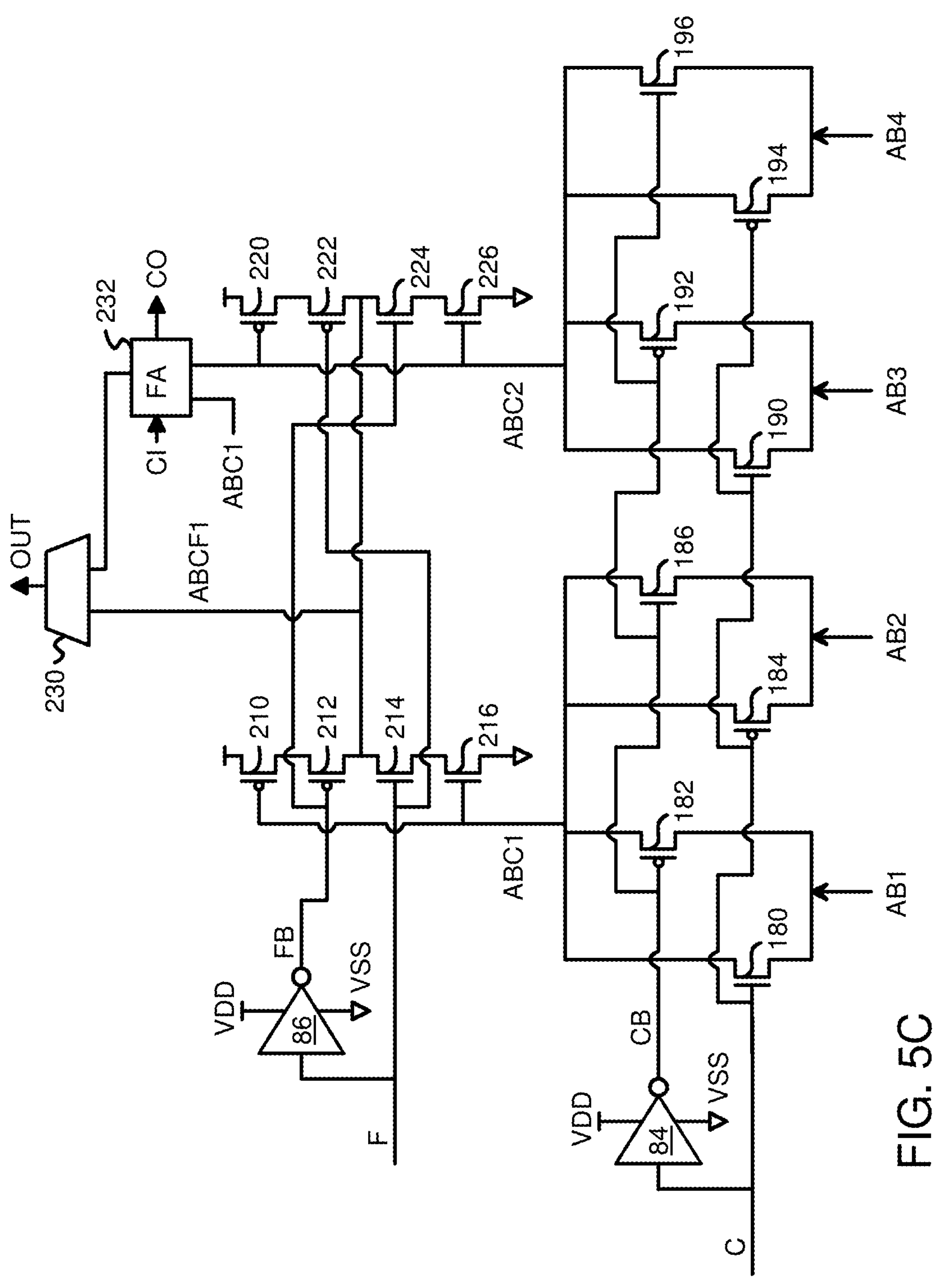

FIGS. 5A-5C show a configurable logic block using the FPGA SRAM cell of FIG. 4. In FIGS. 5A-5B, a row of RAM cells 10 is driven by a row line ENB and an inverse row line EN generated by inverter 36, which uses power supply VDD and the memory ground supply VSSM, as shown later for FIG. 6. VDDM and VSSM are applied to RAM cell 10 and to LUT cell 60. A different pair of bit lines BL, BLB is applied to each column of RAM cell 10. During configuration, ENB goes low and EN goes high, and data is driven onto BL, BLB to write into RAM cells 10. During configuration when reading back data written into RAM cells 10, such as to verify writing, EN goes high and ENB goes low, and data from RAM cell 10 is driven through pass gates 12, 14, 16, 18 onto BL, BLB. For verification, external read circuitry (not shown) can buffer the data on BL, BLB to generate the read data and precharge the signals high prior to a read operation.

After configuration has completed, mission mode is activated to allow the FPGA to perform the configured logic and switching functions. The outputs of the desired logic function were programmed into the 16 RAM cells 10 during configuration. The example of FIGS. 5A-5C show a 1×16 LUT having one binary output and 16 entries that are selected by four binary inputs A, B, C, F.

First input A is applied to the select SEL inputs to LUT cells 60, while inverter 80 generates AB that is applied to the SELB inputs of LUT cells 60. However, the SEL and SELB inputs are swapped or cross over for every pair of LUT cells 60. When input A is high and AB low, SEL is high for the first, third, fifth, and all odd columns of LUT cells 60, and these odd LUT cells 60 each drive the data from their odd RAM cell 10 to their outputs OUT. SEL is low for the second, fourth, sixth, and all even columns of LUT cells 60, and these even LUT cells 60 each tristate or isolate their outputs OUT.

When input A is low and AB high, SEL is high for the second, fourth, sixth, and all even columns of LUT cells 60, and these even LUT cells 60 each drive the data from their odd RAM cell 10 to their outputs OUT. SEL is low for the first, third, fifth, and all odd columns of LUT cells 60, and these odd LUT cells 60 each tristate or isolate their outputs OUT.

Each pair of LUT cells 60 have their outputs OUT connected together, but since their SEL and SELB lines are crossed over within the pair, only one of the two LUT cells 60 in the pair will drive OUT at any time. The other LUT cell 60 isolated its output OUT in a high-impedance state. This is a wired-OR of the two outputs OUT within each pair of LUT cells 60.

The second variable input B is inverted by inverter 82 to generate BB. Second variable input B controls the second level of muxing, where an output (AB1-AB4) is generated for each of the four groups of four columns of LUT cells 60. AB1 is generated for columns 1-4, AB2 is generated for columns 5-8, AB3 is generated for columns 9-12, and AB4 is generated for columns 13-16.

Four transistors 140, 142, 144, 146 select the left pair output when B is low and select the right pair output when B is high to generate AB1. Another four transistors 150, 152, 154, 156 generate AB2 from columns 5-8. In FIG. 5B, another four transistors 160, 162, 164, 166 generate AB3 from columns 9-12 of LUT cells 60, and transistors 170, 172, 174, 176 generate AB4 from columns 13-16 of LUT cells 60. Second variable input B drives the gates of p-channel transistors 140, 150, 160, 170, and the gates of n-channel transistors 144, 154, 164, 174. Inverse second variable input BB drives the gates of p-channel transistors 146, 156, 166, 176, and the gates of n-channel transistors 142, 152, 162, 172.

Both a p-channel and a n-channel transistor are on in parallel, providing a full voltage swing to outputs AB1-AB4. For example, when B is high and BB is low, p-channel transistor 146 is turned on by BB and n-channel transistor 144 is turned on by B, so both transistors 144, 146 conduct OUT from columns 3-4 to output AB1.

In FIG. 5C, a third level of muxing is provided for third variable input C, which is inverted by inverter 84 to generate CB. AB1 drives third-level output ABC1 when C is high, turning on n-channel transistor 180, and CB is low, turning on p-channel transistor 182. However, when C is low, p-channel transistor 184 is on and CB high turn on n-channel transistor 186 to connect AB2 to ABC1. Similarly, p-channel transistors 192, 194 and n-channel transistors 190, 196 connect AB3 to ABC2 when C is high and connect AB4 to ABC2 when C is low.

A fourth level of muxing is provided for fourth variable input F, which is inverted by inverter 86 to generate FB. When F is high, n-channel transistor 214 is on, and FB low turns on p-channel transistor 212 to enable p-channel transistor 210 and n-channel transistor 216 to drive ABC1 to output ABCF1.

ABCF1 is driven by ABC2 by transistors 220, 222, 224, 226 when FB is high and F is low. ABCF1 can drive output OUT through mux 230 when the configurable logic block is configured as a 4-variable LUT.

As a usage example, some configurable logic blocks may include full adder 232. When full adder 232 is enabled, full adder 232 adds ABC1 and ABC2 and carry-in CI to generate a sum and a carry out CO. The sum from full adder 232 can be selected by mux 230 when the CLB output OUT is configured to be the sum from full adder 232. Several configurable logic block can have their carry-outs and carry-ins chained together to provide for multi-bit addition.

FIG. 6 is a table showing boosted supply voltages to the FPGA SRAM cells to improve cell margin and reduce leakage in a FPGA. VDDM is the memory upper voltage supply lines to RAM cells 10 and LUT cells 60. VSSM is the memory lower voltage supply lines to RAM cells 10 and LUT cells 60.

The surrounding logic uses the standard upper power supply VDD and standard lower supply VSS, which can be ground.

During configuration programming or write mode, VDDM is shunted to the standard upper supply voltage VDD. VSSM is shunted to VSS.

During configuration verify or read mode, VDDM is boosted to VDD+, which is the standard VDD power supply voltage that is boosted in voltage by a charge pump. For read back mode with VDDM below about 0.55 volts, VDDM should remain at VDD+100 mV to avoid read disturb. For VDD>0.55 v, VDDM can be shunted to VDD for simplicity. In this case read and write modes maintain VDDM shunted to VDD and VSSM shunted to VSS.

After configuration has been programmed into RAM cells 10 and verified, mission mode can begin. Mission mode is when the FPGA performed the desired logic functions that have been programmed into the FPGA. During mission mode, VDDM is charged pumped up to VDD+, which can be about 50-100 mV above VDD, which will lower the PMOS subthreshold leakage by >10× and could be as high as 50× depending on the process technology. A negative charge pump drives VSSM to VSS−, which can be similarly 100 mV below VSS to benefit from a>10× reduction on NMOS leakage currents.

The higher VDDM voltages and lower VSSM voltages applied to RAM cells 10 and LUT cells 60 reduces leakage through transistors that are turned off, since the outputs of RAM cells 10 and LUT cells 60 are over-driven voltages. For example, when VDDM=VDD+ and VSSM=VSS− are applied to RAM cell 10 (FIG. 4), the data nodes D and DB are driven above VDD to VDD+ for high states, and below VSS to VSS—for low states. When DB is low at VSS-rather than VSS, the gate of n-channel transistor 66 in LUT cell 60 is driven lower, to VSS−, which further turns off transistor 66, preventing or reducing leakage through this OFF transistor. Likewise, when DB is high at VDD+ rather than VDD, the gate of p-channel transistor 62 in LUT cell 60 is driven higher, to VDD+, which further turns off transistor 62, preventing or reducing leakage through this OFF transistor.

Although the leakage through an OFF transistor is small when the gate is driven to VDD or VSS, this leakage can still be significant when there are hundreds or thousands of such OFF transistors in a large FPGA chip. Boosting the gate voltages can reduce leakages through OFF transistor channels by more than an order of magnitude.

FIG. 7 is a schematic diagram of a FPGA SRAM cell for use in a FPGA's configurable switching fabric. Both reading and writing can be performed using bit lines BL, BLB during FPGA configuration. After configuration, during mission mode, reading and writing of RAM cell 10 are not performed, Instead, the data bit stored in RAM cell 10 controls a switching element in switch cell 50 that forms part of configurable switching fabric 110.

Switch cell 50 is a transmission gate with p-channel transistor 62 and n-channel transistor 66 in parallel between input D(0) and output Q. The cell's data bit D from RAM cell 10 drives the gate of n-channel transistor 66, while inverse data bit DB from RAM cell 10 drives the gate of p-channel transistor 62. When D is high and DB is low, both transistors 62, 66 turn on, providing a low-resistance and low-impedance path from D(0) to Q in the switching fabric. When D is low and DB is high, both transistors 62, 66 turn off, providing high-impedance isolation between D(0) and Q. Since p-channel transistor 62 and n-channel transistor 66 are both turned on when D is high and DB is low, there is no voltage drop through the transmission gate as would occur for high voltages when only a n-channel transistor was used.

The sources of p-channel transistors 20, 22 are connected to memory upper supply VDDM, which is boosted above VDD to VDD+ during mission mode to allow D or DB to go higher to VDD+. The higher DB voltage turns off p-channel transistor 62 further to reduce leakage during mission mode. Also, the sources of n-channel transistors 24, 26 are connected to memory lower supply VSSM, which is boosted below VSS to VSS-during mission mode to allow D or DB to go lower to VSS−. The lower D voltage turns off n-channel transistor 66 further to reduce leakage during mission mode when switch cell 50 is turned OFF.

In this embodiment, a local inverter is provided in each RAM cell 10 to generate EN from ENB. Thus only ENB needs to be routed to a single RAM cell in a switching fabric block. Local inverter 44 has EN as its output and ENB as its input.

RAM cell 10 can be read by driving word line ENB low, causing EN to go high, and turning on all four pass transistors 12, 14, 16, 18. Then the data stored in RAM cell 10 is driven onto bit lines BL, BLB. The data read to BL, BLB can be read by downstream logic, such as sense amplifiers, latches, or scan flip-flops. During configuration mode when reading is performed, read speed is not critical, so slow reads can be tolerated. Read disturb can be reduced by using an elevated power-supply voltage (VDDM) to RAM cell 10, as shown in FIGS. 6-7.

RAM cell 10 can be written by driving ENB low, causing EN to go high, and turning on all four pass transistors 12, 14, 16, 18. The write data is driven to bit line BL while the inverse write data is driven to bit line BLB. This write data is driven through pass transistors 12, 14, 16, 18 to write into the cross-coupled inverters. Since there are both p-channel and n-channel transistors in parallel for the pass transistors, there is not a significant voltage drop across the pass transistors that can reduce write margin.

Figure 8:
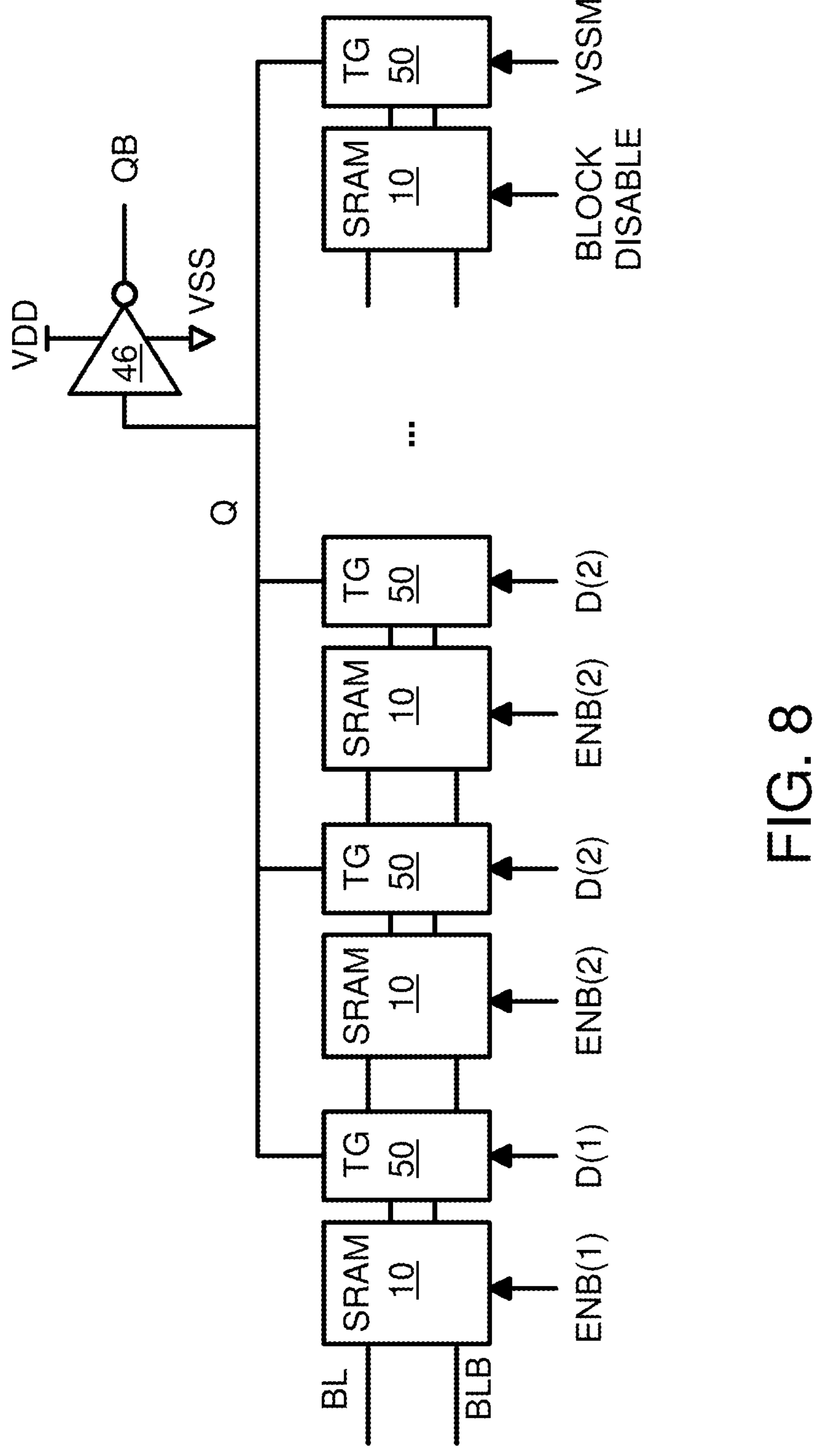
FIG. 8 shows a column of RAM cells and switch cells in a configurable switching fabric.

FIG. 8 shows a column of RAM cells and switch cells in a configurable switching fabric. Bit lines BL, BLB are shared by all RAM cells 10 in this column, but separate row lines ENB are provided for each RAM cell 10 in the column. A local inverter in each RAM cell 10 generates EN from ENB.

When ENB is low and EN is high, all four pass transistors 12, 14, 16, 18 turn on. Both n-channel pass transistors 16, 18 and p-channel pass transistors 12, 14 turn on to improve cell voltage margins by providing a low-impedance path from the cell latch to the bit lines.

Each RAM cell 10 drives its adjacent switch cell 50, as shown in FIG. 7. Each switch cell 50 is controlled by a different RAM cell 10, and each switch cell 50 receives a different input D(1), D(2), D(3), etc. from the switching fabric. However, the Q output of all switch cells 50 are connected together in a wired-OR arrangement. Only one of the switch cells 50 is enabled to drive Q at any time; the other switch cells 50 are all disabled. During configuration, a 1 is written to only one RAM cell 10 while a 0 is written to all other RAM cells 10 in the column.

The entire column (block) can be disabled by programming a 1 into the last RAM cell 10, and programming 0's into all other RAM cells 10. Then switch cell 50 for the last cell drives VSSM from its D(N) input to its Q output.

The wired-OR result on line Q can be inverted by inverter 46 to generate QB, which can be routed to other configurable switching blocks in the configurable switching fabric or directly into a LUT block as one of A, B, C, F inputs.

Since VDDM and VSSM are applied to all RAM cells 10, the gate of p-channel transistor 62 (FIG. 7) is driven by DB from RAM cell 10 to VDD+, significantly reducing any leakage when transistor 62 is off. Also, the gate of n-channel transistor 66 is driven by D to VSS-below VSS to ensure no leakage when switch cell 50 is disabled.

Figure 9:
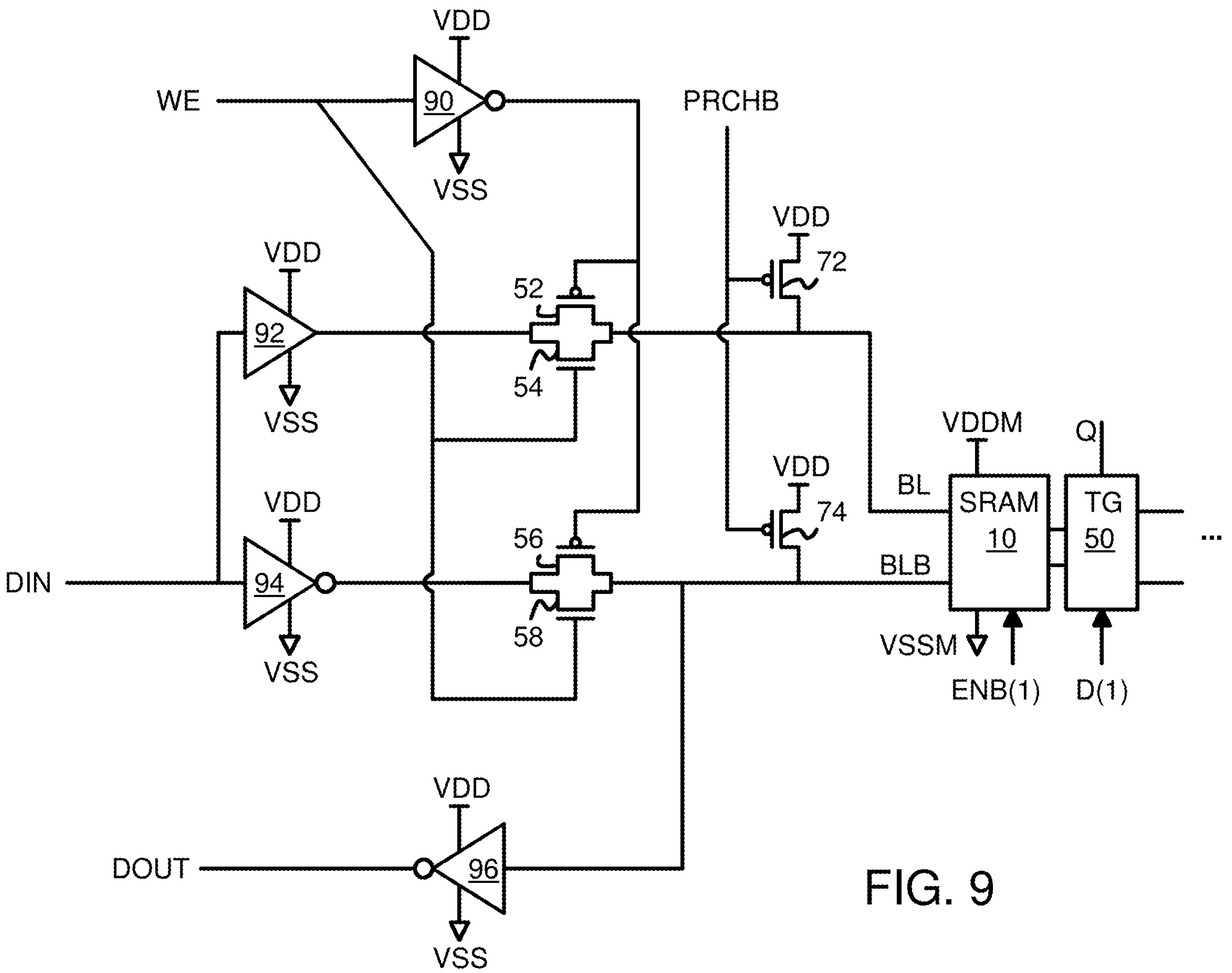
FIG. 9 shows bit line write and read circuitry for the column of RAM cells and switch cells of FIG. 8.

FIG. 9 shows bit line write and read circuitry for the column of RAM cells and switch cells of FIG. 8. RAM cells 10 receive bit line BL, BLB. During configuration write mode, write enable WE is high and driven to the gates of n-channel transistors 54, 56, which turn on to allow data to flow through. WE is inverted by inverter 90 to generate an active-low write enable to the gate of p-channel transistors 52, 54, which also turn on.

During configuration write mode, a bit of configuration data DIN is buffered by buffer 92 and passes through p-channel transistor 52 and n-channel transistor 54 when write enable WE is high to drive the data onto bit line BL. The bit of configuration data DIN is inverted by inverter 94 and passes through p-channel transistor 56 and n-channel transistor 58 when write enable WE is high to drive the inverse data onto bit line BLB.

During configuration read mode, write enable WE is driven low, turning off transistors 52, 54, 56, 58, isolating the write drivers from the bit lines. Instead, the data stored in RAM cell 10 drives bit lines BL, BLB. Read inverter 96 inverts the data on inverse bit line BLB to drive the read output data DOUT. Before read begins, precharge PRCHB is low to turn on p-channel transistors 72, 74, that precharge bit lines BL, BLB high before the read. PRCHB is driven high during the read and during writes.

Alternate Embodiments

Several other embodiments are contemplated by the inventors. For example many combinations and variations of the configuration cell, such as switch cell 50 and LUT cell 60, are possible. The switch fabric block could be any width other than 16. Inverter 44 in the switch cell can be shared with 2 or more adjacent cells. The number of logic inputs A, B, C, F could be more or less than 4 for the LUT block. The logic gates connected to the LUT block could contain muxes, latches, registers or other fixed logic function gates. The polarity of data stored in RAM cell 10 could be inverted, and LUT cell 60 could receive D rather than DB from RAM cell 10. Switch cell 50 can be a bidirectional transmission gate, or could have an added inverter or buffer between input D(0) and the transmission gate. The transmission gate could be integrated with this inverter as a single logic gate.

The invention may be applied to other kinds of Programmable Logic Devices (PLDs) other than Field-Programmable Gate Array (FPGAs). The charge pumped voltages VDD+ and VSS—can be applied to VDDM for RAM cell 10 and switch cell 50 for configurable switching fabric 110, or to RAM cell 10 and LUT cell 60 in configurable logic block 120, or to both. Only VDD+ could be supplied and not VSS−, or VSS-could be supplied and not VDD+ when leakages are not symmetric, or for other reasons.

Local inverter 44 (FIG. 7) has EN as its output and ENB as its input, but that could be reversed in other embodiments. Inverter 44 may receive VDDM as its power supply rather than VDD. When VDDM is charge-pumped to VDD+, the higher VDD+ is applied to the gates of n-channel pass transistors 16, 18, increasing their drive and lowering the impedance through pass transistors 16, 18. VDD+ can be charge-pumped above VDD by 50-150 mV, and VSS—can be charge pumped 50-150 mV below VSS, depending on process and device technology.

RAM cell 10 and LUT cell 60 can be laid out as a single cell of FPGA configuration memory, as can RAM cell 10 and switch cell 50, and can be arrayed into rows and columns for efficient layout. Cell layouts can be mirrored or reflected as desired. While a single-bit entry for the LUT has been shown, a LUT with multiple output bit entries could be constructed by having several single-bit LUT's in parallel, each driving a different output but having the same inputs A, B, C, F.

RAM cell 10, LUT cell 60, and switch cell 50 can operate down to about 0.55 v for advanced Finfet technologies and can operate as low as 0.45 v when a read assist is utilized by keeping VDDM at VDD+ during read back scan mode during configuration. As such the circuit will operate at or below 0.45 v and the high voltage can be limited by technology reliability limits for long-term operational life.

RAM cell 10, LUT cell 60, and switch cell 50 provide configuration bit information of VDD+ and VSS—to logic gates to dramatically reduce (>10×) leakage currents associated with the logic gates. Configuration SRAM bit cell leakage can also be reduced by using ultra high threshold voltage transistors since RAM cell 10 allows for the high Vt devices to be used without degrading cell read disturb and writability. A layout balanced cell with equal number of PMOS and NMOS transistors (5/5) provides a compact layout cell in FinFET and Gate All Around (GAA) technologies.

Deep dynamic voltage and power scaling in advanced node FinFET/GAA technologies is possible. Using a charge pump to generate VDD+, only a single power supply is required for a wide range of Process, supply Voltage, Temperature (PVT) conditions. Power consumption reduction of 10× may be achieved by a combination of a reduced power supply voltage and lowered operating clock frequency. Layout footprint is minimized for advanced node CMOS technologies because NMOS and PMOS transistor counts are balanced in the memory cells.

While write-only RAM cell 10 with pull-up p-channel transistors 20, 22 in the cell latch have been described, pull-up resistors could replace p-channel transistors 20, 22. Various layouts of the SRAM cell are possible.

While operation of the SRAM cell has been described, various modifications can be made. The sense amplifier could be inverted and sense high-going rather than low-going bit lines. A simplified sense amplifier such as a single-ended sense buffer could be used. Using a simple single-ended sense amplifier can reduce costs for applications that do not have a strict timing requirement.

Address inputs, timing signal inputs and other inputs such as for power down or de-selection could be combined by logic within the decoders and other logic upstream to the final inverting buffers. A controller could generate various timing signals from a clock or an access request signal to obtain desired waveforms.

Various architectures can be employed, such as a standard array of rows and columns, a folded bit line architecture, sub-array architectures, split rows or split columns, dummy rows or dummy columns, etc. Columns or rows may be split or fold over such as where two physical columns have their bit lines connected together as a single column from a schematic viewpoint. Arbitrary memory sizes M×N and word lengths Q can be supported.

Various signals could be inverted. For example, the bit lines could be reset low rather than precharged high. The pre-initialized bit lines could be driven high by the selected cell rather than driven low. P-channel and n-channel transistors could be swapped. Inversions could be added or removed at various places, such as by swapping or crossing true and complement bit lines and mux lines, or adding or removing inverters or using non-inverting rather than inverting buffers.

The ground or VSSM connection to the memory cells could connect to a back-bias generator that generates a body or bias voltage that is below ground. The muxing of columns may be much more complex, and there may be sub-arrays and selections of one sub-array and disabling of other sub-arrays. Masking logic may be added that could disable sensing or writing of certain bits within a multi-bit word.

The actual margin values, and the power supply VDD voltages can vary. Supply voltages can be scaled with process improvements and may be dynamically adjusted or switched in a system, such as to reduce over-heating when a temperature alarm is signaled, or when the system enters a low-power mode. A voltage regulator or filter might be added to VDD, or the natural capacitances of the memory cells may be sufficient to regulate VDD.

Many layouts of the cell are possible within the spirit of the invention, and those skilled in the art will be able to make many modifications.

The n-channel access transistor has been described as having a source diffusion connected to the bit line and a drain diffusion connected to the cross-coupled inverters. However, those skilled in the art will recognize that MOS transistors are bi-directional in nature and the source and drain diffusions are physically indistinguishable. For normal bit-line biasing, the source terminal of an n-channel transistor has a lower voltage or potential than the drain terminal, but if the applied voltage is reversed then the source and drain terminals can reverse with the drain becoming the source and vice-versa. Thus the terms "source" and "drain" are used interchangeably, and for both p-channel and n-channel transistors.

Additional leaker devices such as resistors and small transistors could be added. Parasitic capacitances and resistances may be used from some components, depending on the process and device sizes used. Bias, VDD, and voltage values may vary somewhat due to process, temperature, and design variances.

While descriptions of current flows and operations have been presented, these are theoretical, and the theories may be incomplete or even incorrect. Especially for small devices, currents may flow in unusual ways and using mechanisms that have not yet been thoroughly researched and understood. Second and third order effects may also be present.

Cutouts in diffusion and other regions may be used. Other shapes and physical layouts may be substituted, such as intermingled fingers. For FinFET transistors, fins could intersect other fins, bend, or have various macro geometries and layouts.

Devices may be implemented using n-channel, p-channel, or bipolar transistors, or junctions within these transistors, or carbon nanotubes. A capacitor could be attached to a resistance to provide an R-C time delay, or more complex circuits such as active triggering circuits may be added. In some embodiments, high-voltage transistors may be used rather than low-voltage transistors with appropriate bias conditions. The gate lengths and spacings can be increased to provide better protection from damage.

Different transistor, capacitor, resistor, and other device sizes can be used, and various layout arrangements can be used, such as multi-leg, ring, doughnut or irregular-shape transistors. Additional taps, guard rings, transistors, and other components may be added. More than one power supply may be used.

More complex buffers, level shifters, or other components could be substituted or added. Inversions could be added at various locations. Hysteresis of other delays and output wave shaping could be added. Rather than use CMOS inverters, other kinds of buffer circuits, selectors, or muxes may be used.

Different transistor, capacitor, resistor, and other device sizes can be used, and various layout arrangements can be used, such as multi-leg, ring, doughnut or irregular-shape transistors. Currents can be positive or negative currents and flow in either direction. Many second and third order circuit effects may be present and may be significant, especially for smaller device sizes. A circuit simulation may be used to account for these secondary factors during design.

Devices may be implemented using n-channel, p-channel, or bipolar transistors, or junctions within these transistors. The gate lengths and spacings can be increased to provide better protection from damage.

Many variations of IC semiconductor manufacturing processes are possible. Various materials may be used. Additional process steps may be added, such as for additional metal layers or for other transistor types or modification of standard complementary metal-oxide-semiconductor (CMOS) transistors when the transistors are integrated onto a larger device. While complementary metal-oxide-semiconductor (CMOS) transistors have been described, other kinds of transistors could be substituted for some embodiments, such as n-channel only, p-channel only when the output swing can be limited, or various alternate transistor technologies such as Bipolar or BiCMOS. The CMOS process may be a Fin Field-Effect Transistor (FinFET) process.

Terms such as up, down, above, under, horizontal, vertical, inside, outside, are relative and depend on the viewpoint and are not meant to limit the invention to a particular perspective. Devices may be rotated so that vertical is horizontal and horizontal is vertical, so these terms are viewer dependent.

The background of the invention section may contain background information about the problem or environment of the invention rather than describe prior art by others. Thus inclusion of material in the background section is not an admission of prior art by the Applicant.

Any advantages and benefits described may not apply to all embodiments of the invention. When the word "means" is recited in a claim element, Applicant intends for the claim element to fall under 35 USC Sect. 112, paragraph 6. Often a label of one or more words precedes the word "means". The word or words preceding the word "means" is a label intended to ease referencing of claim elements and is not intended to convey a structural limitation. Such means-plus-function claims are intended to cover not only the structures described herein for performing the function and their structural equivalents, but also equivalent structures. For example, although a nail and a screw have different structures, they are equivalent structures since they both perform the function of fastening. Claims that do not use the word "means" are not intended to fall under 35 USC Sect. 112, paragraph 6. Signals are typically electronic signals, but may be optical signals such as can be carried over a fiber optic line.

The foregoing description of the embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

The invention claimed is:

1. A Field-Programmable Gate Array (FPGA) comprising:

a plurality of Configurable Logic Blocks, each Configurable Logic Block (CLB) having a plurality of CLB cells, wherein a CLB cell in the plurality of CLB cells comprises:

a first pull-up p-channel transistor having a source connected to a power supply, a drain connected to a first node, and a gate connected to a second node;

a first pull-down n-channel transistor having a source connected to a ground voltage supply, a drain connected to the first node, and a gate connected to the second node;

a second pull-up p-channel transistor having a source connected to the power supply, a drain connected to the second node, and a gate connected to the first node;

a second pull-down n-channel transistor having a source connected to the ground voltage supply, a drain connected to the second node, and a gate connected to the first node;

a first n-channel pass transistor having a gate connected to a word line, and a channel connected between the first node and a first bit line;

a second n-channel pass transistor having a gate connected to the word line, and a channel connected between the second node and a second bit line;

a first p-channel pass transistor having a gate connected to an inverse word line, and a channel connected between the first node and the first bit line;

a second p-channel pass transistor having a gate connected to the inverse word line, and a channel connected between the second node and the second bit line;

a configuration data p-channel transistor having a gate connected to the second node, a source connected to the power supply, and a drain connected to a first configuration-port node;

a configuration select p-channel transistor having a gate connected to an inverse first select input, and a channel connected between the first configuration-port node and a cell output;

a configuration data n-channel transistor having a gate connected to the second node, a source connected to the ground voltage supply, and a drain connected to a second configuration-port node; and a configuration select n-channel transistor having a gate connected to a first select input, and a channel connected between the second configuration-port node and the cell output;

wherein a configuration bit of a Look-Up Table (LUT) is written into the CLB cell by driving the configuration bit onto the first bit line and an inverse of the configuration bit onto the second bit line and driving the word line high and driving the inverse word line low, wherein the cell output of each pair of the CLB cell are connected together as a pair output;

wherein the first select input and the inverse first select input are swapped within each pair of the CLB cell, wherein one CLB cell in a pair is enabled to drive the cell output and another CLB cell in the pair is disabled from driving the cell output by the first select input.

2. The FPGA of claim 1 wherein each CLB further comprises:

a second-level mux, receiving as inputs the pair output from all pairs of the CLB cell, the second-level mux receiving a second select input, and for each set of two pairs of the CLB cell, the second-level mux selecting the pair output for a left pair of the CLB cell as a second-level output when a second select input is active, and the second-level mux selecting the pair output for a right pair of the CLB cell as the second-level output when the second select input is not active.

3. The FPGA of claim 2 wherein each CLB further comprises:

a third-level mux, receiving as inputs the second-level outputs from the second-level mux, the third-level mux receiving a third select input, and for each set of four pairs of the CLB cell, the third-level mux selecting the second-level output for a left group of four CLB cells as a third-level output when a third select input is active, and the third-level mux selecting the second-level output for a right group of four CLB cells as the third-level output when the third select input is not active; and a top-level mux, receiving as inputs the third-level outputs from the third-level mux, the top-level mux receiving a fourth select input, the top-level mux selecting the third-level output for a left group of four CLB cells as a top-level output when a fourth level output is active, the top-level mux selecting the third-level output for a right group of four CLB cells as the top-level output when the fourth select input is not active.

4. The FPGA of claim 3 wherein the CLB implements a 16-entry Look-Up Table (LUT) having entries stored in the plurality of CLB cells that are selected by the first select input, the second select input, the third select input, and the fourth select input.

5. The FPGA of claim 3 wherein the CLB further comprises:

a full adder, receiving an summing the third-level outputs from the third-level mux, the full adder generating a sum of the third-level outputs;

an output mux that selects the sum generated by the full adder as a CLB output when the full adder is enabled, and selects the top-level output as the CLB output when the full adder is not active.

6. The FPGA of claim 5 wherein the full adder further comprises a carry-in input generated as a carry-out output from a full adder in another CLB, the full adder including the carry-in input when generating the sum, the full adder also generating a carry-out output.

7. The FPGA of claim 3 further comprising:

a configurable switching fabric comprising a plurality of configurable switching cells, a configurable switching cell in the plurality of configurable switching cells comprising:

a third pull-up p-channel transistor having a source connected to a power supply, a drain connected to a third node, and a gate connected to a fourth node;

a third pull-down n-channel transistor having a source connected to a ground voltage supply, a drain connected to the third node, and a gate connected to the fourth node;

a fourth pull-up p-channel transistor having a source connected to the power supply, a drain connected to the fourth node, and a gate connected to the third node;

a fourth pull-down n-channel transistor having a source connected to the ground voltage supply, a drain connected to the fourth node, and a gate connected to the third node;

a third n-channel pass transistor having a gate connected to a second word line, and a channel connected between the third node and a third bit line;

a fourth n-channel pass transistor having a gate connected to the second word line, and a channel connected between the fourth node and a fourth bit line;

a third p-channel pass transistor having a gate connected to an inverse second word line, and a channel connected between the third node and the third bit line;

a fourth p-channel pass transistor having a gate connected to the inverse second word line, and a channel connected between the fourth node and the fourth bit line;

a configuration switch p-channel transistor having a gate connected to the fourth node, a source connected to a switch output, and a drain connected to a switch input; and a configuration switch n-channel transistor having a gate connected to the third node, a source connected to the switch input, and a drain connected to the switch output;

wherein the switch input and the switch output are nodes in the configurable switching fabric;

wherein a configuration bit of the configurable switching fabric is written into the configurable switching cell by driving the configuration bit onto the third bit line and an inverse of the configuration bit onto the fourth bit line and driving the second word line high and driving the inverse second word line low.

8. The FPGA of claim 7 wherein the plurality of configurable switching cells comprises N configurable switching cells, wherein N is a whole number of at least 4;

wherein the switch output of all N configurable switching cells are connected together on an output switch line;

wherein each of the N configurable switching cells has a switch input that receives a different switch node in the configurable switching fabric;

wherein the N configurable switching cells comprise a N:1 switch.

9. The FPGA of claim 7 wherein the plurality of configurable switching cells comprises N+1 configurable switching cells, wherein N is a whole number of at least 4;

wherein the switch output of all N+1 configurable switching cells are connected together on an output switch line;

wherein N of the N+1 configurable switching cells has a switch input that receives a different switch node in the configurable switching fabric;

wherein a final (N+1)th configurable switching cell has a switch input that is connected to the ground voltage supply;

wherein a configuration bit programmed into the final (N+1)th configurable switching cell is a block disable bit for disabling muxing;

wherein the N+1 configurable switching cells comprise a N: 1 switch with a block disable.

10. The FPGA of claim 8 wherein the plurality of configurable switching cells each further comprise:

a local inverter for inverting the second word line to generate the inverse second word line, or for inverting the inverse second word line to generate the second word line.

11. The FPGA of claim 10 wherein the third bit line and the fourth bit line are connected to all configurable switching cells in a configurable switching block of the configurable switching fabric;

wherein separate enable signals are applied to the second word line for each configurable switching cell in the configurable switching block of the configurable switching fabric;

whereby configurable switching cells are separately enabled for writing but share bit lines.

12. The FPGA of claim 8 further comprising:

a voltage booster that boosts the power supply to the plurality of configurable switching cells to a boosted voltage above a standard power supply voltage during mission mode when the second word line is not activated;

wherein during configuration mode the voltage booster is disabled, wherein the power supply to the plurality of configurable switching cells is the standard power supply voltage;

wherein the power supply to the plurality of configurable switching cells is boosted during mission mode but not boosted during configuration mode;

wherein the second word line is not activated during mission mode but is only activated during configuration mode.

13. The FPGA of claim 8 wherein the power supply to the plurality of CLB cells and to the plurality of configurable switching cells is a boosted power supply;

wherein the power supply to the second-level mux, the third-level mux, and the top-level mux is a standard power supply that is used by logic outside the CLB cell and the plurality of configurable switching cells;

wherein the boosted power supply is generated by a charge pump that boosts the boosted power supply to a voltage above a voltage of the standard power supply;

wherein the ground voltage supply to the plurality of CLB cells and to plurality of configurable switching cells is a reduced ground having a voltage that is below a ground voltage;

wherein the ground voltage is supplied to the second-level mux, the third-level mux, and the top-level mux, wherein the ground voltage is a standard power supply that is used by logic outside the CLB cell and the plurality of configurable switching cells.

14. A field-programmable logic device comprising:

a configurable switching fabric having a plurality of fabric cells, wherein each fabric cell comprises:

a SRAM cell that comprises:

a first pull-up transistor and a first pull-down transistor connected in series between a memory upper power supply and a memory lower power supply, the first pull-up transistor and the first pull-down transistor connected at a first latch node;

a second pull-up transistor and a second pull-down transistor connected in series between the memory upper power supply and the memory lower power supply, the second pull-up transistor and the second pull-down transistor connected at a second latch node;

wherein gates of the first pull-up transistor and of the first pull-down transistor are driven by the second latch node between the second pull-up transistor and the second pull-down transistor;

wherein gates of the second pull-up transistor and of the second pull-down transistor are driven by the first latch node between the first pull-up transistor and the first pull-down transistor;

a first n-channel pass transistor connected between the first latch node and a first write bit line, and having a gate connected to a write word line;

a second n-channel pass transistor connected between the second latch node and a second write bit line, and having a gate connected to the write word line;

a first p-channel pass transistor connected between the first latch node and the first write bit line, and having a gate connected to an inverse write word line;

a second p-channel pass transistor connected between the second latch node and the second write bit line, and having a gate connected to the inverse write word line;

a switch cell that comprises:

a p-channel switch transistor having a gate connected to the second latch node from the SRAM cell, and a channel that conducts current controlled by the gate between a switch input node and a switch output node; and an n-channel switch transistor having a gate connected to the first latch node from the SRAM cell, and a channel that conducts current controlled by the gate between the switch input node and the switch output node;

wherein reading and writing during a configuration mode are performed by activating the write word line high and the inverse write word line low;

wherein during writing configuration data is driven onto the first write bit line and an inverse of the configuration data is driven onto the second write bit line;

a plurality of configurable logic blocks, each configurable logic block comprising:

a SRAM cell that comprises:

a third pull-up transistor and a third pull-down transistor connected in series between the memory upper power supply and the memory lower power supply, the third pull-up transistor and the third pull-down transistor connected at a third latch node;

a fourth pull-up transistor and a fourth pull-down transistor connected in series between the memory upper power supply and the memory lower power supply, the fourth pull-up transistor and the fourth pull-down transistor connected at a fourth latch node;

wherein gates of the third pull-up transistor and of the third pull-down transistor are driven by the fourth latch node between the fourth pull-up transistor and the fourth pull-down transistor;

wherein gates of the fourth pull-up transistor and of the fourth pull-down transistor are driven by the third latch node between the third pull-up transistor and the third pull-down transistor;

a third n-channel pass transistor connected between the third latch node and a third write bit line, and having a gate connected to a second word line;

a fourth n-channel pass transistor connected between the fourth latch node and a fourth write bit line, and having a gate connected to the second word line;

a third p-channel pass transistor connected between the third latch node and the third write bit line, and having a gate connected to an inverse second word line;

a fourth p-channel pass transistor connected between the fourth latch node and the fourth write bit line, and having a gate connected to the inverse second word line;

a logic cell that comprises:

a p-channel switch transistor having a gate connected to the fourth latch node from the SRAM cell, and a channel that conducts current controlled by the gate between the memory upper power supply and an upper node;

a p-channel select transistor having a gate receiving an inverse of a first logic signal and having a channel that connects current controlled by the gate between the upper node and a cell output node;

an n-channel select transistor having a gate receiving the first logic signal and having a channel that connects current controlled by the gate between the cell output node and a lower node;

an n-channel switch transistor having a gate connected to the fourth latch node from the SRAM cell, and a channel that conducts current controlled by the gate between the lower node and the memory lower power supply;

wherein reading and writing during the configuration mode are performed by activating the second word line high and the inverse second word line low;

wherein during writing configuration data is driven onto the third write bit line and an inverse of the configuration data is driven onto the fourth write bit line;

a voltage booster that receives a standard upper power supply and generates the memory upper power supply, the voltage booster increasing a standard power supply voltage of the standard upper power supply to a boosted power supply voltage of the memory upper power supply;

wherein the memory upper power supply voltage is at least 0.05 volt greater than the standard power supply voltage;

wherein the voltage booster is enabled for mission mode;

wherein the memory upper power supply is shunted to the standard upper power supply when the voltage booster is not enabled;

wherein the configuration data is written into the SRAM cell only during configuration mode and never during mission mode; and a voltage reducer that receives a standard lower power supply and generates the memory lower power supply, the voltage reducer decreasing a standard lower power supply voltage of the standard lower power supply to a reduced power supply voltage of the memory lower power supply;

wherein the memory lower power supply voltage is at least 0.05 volt less than the standard lower power supply voltage;

wherein the voltage reducer is enabled for mission mode and disabled for configuration mode;

wherein the configuration data is written into the SRAM cell only during configuration mode and never during mission mode.

* * * * *